United States Patent
Butzmann (10) Patent No.: US 10,490,863 B2
(45) Date of Patent: Nov. 26, 2019

(54) METHOD FOR TRANSFERRING A MINIMUM AND/OR A MAXIMUM VALUE OF A BATTERY SYSTEM PARAMETER AND BATTERY SYSTEM FOR CARRYING OUT SUCH A METHOD

(71) Applicants: Robert Bosch GmbH, Stuttgart (DE); Samsung SDI Co., Ltd., Yongin-si, Gyeonggi-do (KR)

(72) Inventor: Stefan Butzmann, Schalksmühle (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 472 days.

(21) Appl. No.: 15/102,881

(22) PCT Filed: Dec. 5, 2014

(86) PCT No.: PCT/EP2014/076667
§ 371 (c)(1),
(2) Date: Jun. 9, 2016

(87) PCT Pub. No.: WO2015/086442
PCT Pub. Date: Jun. 18, 2015

(65) Prior Publication Data
US 2016/0308257 A1    Oct. 20, 2016

(30) Foreign Application Priority Data
Dec. 9, 2013    (DE) .................. 10 2013 225 243

(51) Int. Cl.
*H01M 10/42*    (2006.01)
*H04Q 9/00*    (2006.01)
(Continued)

(52) U.S. Cl.
CPC ...... *H01M 10/4264* (2013.01); *G01R 31/396* (2019.01); *H01M 10/0525* (2013.01);
(Continued)

(58) Field of Classification Search
CPC ............ G01R 31/396; H01M 10/0525; H01M 10/425; H01M 10/4264; H01M 10/633;
(Continued)

(56) References Cited

U.S. PATENT DOCUMENTS

2003/0175560 A1    9/2003   Kim et al.
2007/0080662 A1    4/2007   Wu
(Continued)

FOREIGN PATENT DOCUMENTS

DE    37 02 591 A1    8/1988
DE    600 03 581 T2   4/2004
(Continued)

OTHER PUBLICATIONS

International Search Report corresponding to PCT Application No. PCT/EP2014/076667, dated Jun. 10, 2015 (German and English language document) (7 pages).

*Primary Examiner* — Anthony R Jimenez
(74) *Attorney, Agent, or Firm* — Maginot, Moore & Beck LLP (57) ABSTRACT

A method for transferring a minimum and/or a maximum value of a battery system parameter from a quantity of values of said battery system parameter in a battery system comprising a plurality of battery cells, wherein the minimum value of the battery system parameter is transferred via a first data line and/or the maximum value of the battery system parameter is transferred via a second data line. A periodic clock signal having a permanent period duration is generated. To transfer the minimum value of the battery system parameter for each value of the battery system parameter (Continued)

phase-synchronously to the clock signal, a first signal is generated and given to the first data line, and/or to transfer the maximum value of the battery system parameter for each value of the battery system parameter phase-synchronously to the clock signal, a second signal is generated and given to the second data line.

11 Claims, 7 Drawing Sheets

(51) Int. Cl.
    *H01M 10/633* (2014.01)
    *H01M 10/0525* (2010.01)
    *H04Q 9/02* (2006.01)
    *G01R 31/396* (2019.01)
    *H01M 10/48* (2006.01)
    *H03K 4/50* (2006.01)

(52) U.S. Cl.
    CPC ....... *H01M 10/425* (2013.01); *H01M 10/633* (2015.04); *H04Q 9/00* (2013.01); *H04Q 9/02* (2013.01); *H01M 10/482* (2013.01); *H01M 10/486* (2013.01); *H01M 2010/4271* (2013.01); *H01M 2010/4278* (2013.01); *H01M 2220/20* (2013.01); *H03K 4/50* (2013.01); *H04Q 2209/10* (2013.01)

(58) Field of Classification Search
    CPC ............. H01M 10/482; H01M 10/486; H01M 2010/4271; H01M 2010/4278; H01M 2220/20; H04Q 9/00; H04Q 9/02; H04Q 2209/10; H03K 4/50
    USPC .......................................................... 429/50
    See application file for complete search history.

(56) References Cited

U.S. PATENT DOCUMENTS

| | | |
|---|---|---|
| 2009/0305086 A1 | 12/2009 | Lee et al. |
| 2010/0194345 A1 | 8/2010 | Li |
| 2012/0112701 A1 | 5/2012 | Ito et al. |
| 2013/0002232 A1 | 1/2013 | Reed et al. |
| 2013/0067256 A1 | 3/2013 | Shiraishi |
| 2014/0045004 A1* | 2/2014 | Butzmann ................ H04Q 9/00 429/61 |

FOREIGN PATENT DOCUMENTS

| | | |
|---|---|---|
| DE | 10 2005 020 835 A1 | 3/2006 |
| DE | 10 2010 063 258 A1 | 6/2012 |
| DE | 10 2011 079 292 A1 | 1/2013 |
| DE | 10 2012 104 790 A1 | 1/2013 |
| DE | 10 2011 115 825 A1 | 4/2013 |
| EP | 2 428 809 A2 | 3/2012 |
| JP | 2001-25173 A | 1/2001 |
| JP | 2012-47520 A | 3/2012 |
| KR | 2010-0068746 A | 6/2010 |

\* cited by examiner

METHOD FOR TRANSFERRING A MINIMUM AND/OR A MAXIMUM VALUE OF A BATTERY SYSTEM PARAMETER AND BATTERY SYSTEM FOR CARRYING OUT SUCH A METHOD

CROSS-REFERENCE TO RELATED APPLICATIONS

This application is a 35 U.S.C. § 371 National Stage Application of PCT/EP2014/076667, filed on Dec. 5, 2014, which claims the benefit of priority to Serial No. DE 10 2013 225 243.9, filed on Dec. 9, 2013 in Germany, the disclosures of which are incorporated herein by reference in their entirety.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

(1) Field of the Invention

The disclosure relates to a method for transferring a minimum and/or a maximum value of a battery system parameter from a set of values for this battery system parameter in a battery system comprising a plurality of battery cells, the minimum value of the battery system parameter being transferred via a first data line and/or the maximum value of the battery system parameter being transferred via a second data line.

The disclosure also relates to a battery system having a plurality of battery cells and a battery management system.

(2) Description of Related Art Including Information Disclosed Under 37 CFR 1.97 and 1.98

Battery systems having a plurality of battery cells which are electrically connected to one another, in particular having a plurality of rechargeable lithium ion cells which are electrically connected to one another, are used, in particular, to provide the required electrical energy in hybrid, plug-in hybrid or electric vehicles. A battery system usually also comprises a battery management system for monitoring and regulating the battery cells of the battery system or for monitoring and regulating a plurality of battery cells of the battery system which are electrically connected to one another, in particular for monitoring and regulating one or more battery modules of the battery system. Such a battery management system usually comprises at least one control device unit and cell monitoring units, in particular so-called cell supervision circuits (CSC). The battery management system of the battery system is responsible, in particular, for ensuring that particular battery system parameters do not exceed or undershoot predefined limit values during operation of the battery system. The battery management system should therefore ensure, in particular, that battery cell temperatures or battery cell voltages as battery system parameters always remain within predefined limits, for example.

In order to monitor and regulate the battery system parameters, battery systems have units for recording and digitizing battery system parameters. The document DE 10 2010 063 258 A1 discloses, as a unit for recording a battery system parameter, an apparatus for measuring a cell voltage of a battery, for example. Further apparatuses for monitoring and/or recording battery system parameters are also known, for example, from the documents DE 600 03 581 T2, JP 2001025173 A and DE 37 02 591 C2.

Since, as already stated, the battery system parameters should not exceed or undershoot particular limit values, minimum and/or maximum battery system parameters of a battery system are particularly relevant. So that these minimum and/or maximum battery system parameters can be used when monitoring and regulating the battery system, these parameters must be transferred inside the battery system, in particular from the units for recording at least one battery system parameter to a central control device unit of the battery system. In this respect, it is known practice, in particular, to transfer recorded battery system parameters in an analog manner, for example using the daisy chain principle.

The disadvantage of such analog transfer is that it is susceptible to electromagnetic interference and is therefore less reliable.

Against this background, it is an object of the disclosure to improve the transfer of a minimum and/or a maximum value of a battery system parameter from a plurality of recorded values for this battery system parameter in a battery system, in particular to the effect that the transfer is not very susceptible to interference and is advantageously robust with respect to electromagnetic interference.

BRIEF SUMMARY OF THE INVENTION

In order to achieve the object, a method for transferring a minimum and/or a maximum value of a battery system parameter from a set of values for this battery system parameter in a battery system comprising a plurality of battery cells is proposed, the minimum value of the battery system parameter being transferred via a first data line and/or the maximum value of the battery system parameter being transferred via a second data line. According to the disclosure, a periodic clock signal having a fixed period duration is generated in this case. In order to transfer the minimum value of the battery system parameter, a first signal which can assume either a first signal state or a second signal state is also generated for each value of the battery system parameter synchronously in phase with the clock signal and is passed to the first data line, a minimum battery system parameter on the first data line being represented by a transition from the first signal state to the second signal state, and the minimum value of the battery system parameter being represented by the duration of time for which the second signal state is held based on the period duration of the clock signal, and/or, in order to transfer the maximum value of the battery system parameter, a second signal which can assume either a first signal state or a second signal state is generated for each value of the battery system parameter synchronously in phase with the clock signal and is passed to the second data line, a maximum battery system parameter on the second data line being represented by a transition from the second signal state to the first signal state, and the maximum value of the battery system parameter being represented by the duration of time for which the first signal state is held based on the period duration of the clock signal.

Battery system parameters are, in particular, measurement variables recorded inside the battery system. In particular, battery system parameters are electrical voltages, in particular battery cell voltages, battery cell temperatures, battery cell currents, states of charge (SOC) of a battery cell and/or ageing states of a battery (SOH: state of health).

In particular, provision is made for the set of values for a battery system parameter to be recorded by units of the battery system, in particular by cell monitoring units, preferably by so-called cell supervision circuits (CSC). Provision is also made, in particular, for minimum and/or maximum values of a battery system parameter to be transferred from these units of the battery system to at least one control device unit of the battery system, preferably to a central control device unit such as, in particular, a battery control unit (BCU). Provision is preferably also made for the at least one control device unit of the battery system to generate the periodic clock signal having the fixed period duration, this clock signal advantageously being respectively transferred to the further units of the battery system, in particular the cell monitoring units, via a signal line.

The clock signal is preferably a square-wave signal. In this case, the clock signal changes within a fixed period duration between a first signal state (preferably "low") and a second signal state (preferably "high"). In this case, the clock signal is transferred at the same time to each of the units of the battery system which record values of a battery system parameter so that the minimum and/or maximum value of this battery system parameter can be transferred from this set of values for this battery parameter.

The minimum and maximum values of a battery system parameter are particularly preferably transferred. In particular, provision is made for the first signal and/or the second signal to be able to change between the signal states of "low" and "high", the first signal state preferably being "low" and the second signal state preferably being "high". In this case, the transfer is advantageously implemented in the form of a three-wire protocol. The generated first signal and/or the generated second signal is/are preferably each pulse-width-modulated signals (PWM signals), the pulse length of the signals based on the period duration of the clock signal respectively representing the respective value of the battery system parameter. The maximum reproducible value of a battery system parameter is advantageously defined by selecting the period duration of the clock signal. A minimum value and/or a maximum value of a battery system parameter is/are therefore advantageously transferred in a binary manner. As a result, the transfer is advantageously comparatively robust with respect to electromagnetic interference and is not very susceptible to interference.

In particular, provision is made, as one preferred configuration of the method according to the disclosure, for the first signal on the first data line which was passed to the first data line for a value of the battery system parameter to be logically linked to the first signals passed to the first data line at the same time for the further values of the battery system parameter, with the result that the minimum value of the battery system parameter is transferred via the first data line, and/or for the second signal on the second data line which was passed to the second data line for a value of the battery system parameter to be logically linked to the second signals passed to the second data line at the same time for the further values of the battery system parameter, with the result that the maximum value of the battery system parameter is transferred via the second data line. The logical linking is preferably achieved in each case by means of an AND operation (ANDing). The first signals are preferably ANDed by passing the first signals to the first data line via an open collector output in each case. The duty factor of the signal on the first data line, that is to say the ratio of the pulse duration of the signal on the first data line to the period duration of the clock signal, then advantageously indicates the value of the minimum battery system parameter. The second signals which are passed to the second data line are preferably ANDed in a similar manner. Details of the logical linking of the first signals and/or of the second signals are explained in more detail in connection with the exemplary embodiments illustrated in the drawings.

According to another advantageous configuration of the method according to the disclosure, as the set of values for the battery system parameter, the minimum voltage and/or the maximum voltage of a battery cell of a battery module of the battery system is/are respectively recorded and the minimum value of the recorded minimum voltage and/or the maximum value of the recorded maximum voltage is/are transferred, the first signal being generated for each battery module for the purpose of transferring the minimum value of the recorded minimum voltage synchronously in phase with the clock signal in each case and being passed to the first data line, and/or the second signal being generated for each battery module for the purpose of transferring the maximum value of the recorded maximum voltage synchronously in phase with the clock signal in each case and being passed to the second data line. The battery system preferably has at least one microcontroller for each battery module in this case, which microcontroller is advantageously designed to evaluate recorded battery cell voltages with regard to a minimum and/or a maximum value of a recorded battery cell voltage.

One particularly advantageous configuration variant of the method according to the disclosure provides, as the set of values for the battery system parameter, for the battery cell voltage of a battery cell of the battery system to be recorded in each case and for the minimum value of the recorded battery cell voltage and/or the maximum value of the recorded battery cell voltage to be transferred. the first signal being generated for each battery cell for the purpose of transferring the minimum value of the recorded battery cell voltage synchronously in phase with the clock signal in each case and being passed to the first data line, and/or the second signal being generated for each battery cell for the purpose of transferring the maximum value of the recorded battery cell voltage synchronously in phase with the clock signal in each case and being passed to the second data line. In this case, a minimum value of a battery cell voltage is, in particular at a recording time, that value from a set of battery cell voltages recorded at that time which represents the minimum battery cell voltage from the set of recorded battery cell voltages at said time. A maximum value of a battery cell voltage is, in particular at a recording time, that value from a set of battery cell voltages recorded at that time which represents the maximum battery cell voltage from the set of recorded battery cell voltages at said time.

In another advantageous configuration of the method according to the disclosure, a sawtooth voltage is generated synchronously in phase with the clock signal, a voltage whose minimum and/or maximum value is intended to be transferred being recorded and the first signal and/or the second signal being generated, by respectively comparing the recorded voltage with the sawtooth voltage using a comparator unit having a positive input and an inverting input, as the output signal from the comparator unit. In this configuration, there is advantageously no need for a microcontroller or a similar evaluation device for determining minimum and/or maximum battery system parameters from a set for said battery system parameter.

In particular, in order to generate the first signal, the above-mentioned configuration of the method according to the disclosure provides for the recorded voltage to be respectively applied to the positive input of the comparator unit and the sawtooth voltage to be respectively applied to the inverting input of the comparator unit, and/or, in order to generate the second signal, for the recorded voltage to be respectively applied to the inverting input of the comparator unit and the sawtooth voltage to be respectively applied to the positive input of the comparator unit.

The first signal is advantageously passed to the first data line via a DC isolation device and/or the second signal is passed to the second data line via a DC isolation device. The DC isolation device is preferably an isolator or an optocoupler. In order to record and transfer the minimum value of a recorded voltage, provision is made in this case, in particular, for an isolator unit connected downstream of the output of the comparator unit to be pulled to the signal state "low" on the output side if the respective recorded voltage exceeds the sawtooth voltage. In order to generate the second signal for transferring the maximum value of a recorded voltage, provision is made, in particular, for an isolator unit connected downstream of the output of the comparator unit to be pulled to the signal state "high" on the output side if the sawtooth voltage exceeds the relevant recorded voltage.

In order to generate the sawtooth voltage, another advantageous configuration of the method according to the disclosure provides for the clock signal for each sawtooth voltage to be generated to respectively control a switching element, the switching element closing during a first signal state of the clock signal and opening during the second signal state of the clock signal, a capacitor being charged in a ramped manner when the switching element is open and the capacitor being discharged when the switching element is closed. A MOSFET (metal oxide semiconductor field-effect transistor) is preferably provided as the switching element. The current charging the capacitor is advantageously regulated in such a manner that the voltage of the capacitor corresponds to a predefined reference voltage at the time at which the clock signal changes from the first signal state to the second signal state. This advantageously means that the ramp gradient is the same in all battery modules of the battery system which are independent of one another.

One advantageous development of the method according to the disclosure provides for a first signal passed to the first data line and/or a second signal passed to the second data line to be received and evaluated by units of the battery system, in particular by cell monitoring units of the battery system. In this case, the first signals and/or the second signals are advantageously directly received by the units of the battery system without being diverted via a central control device unit. The first signals and/or second signals made available to the units of the battery system can be advantageously used by the units to monitor and/or regulate the battery system and/or to monitor and/or regulate a plurality of battery cells of the battery system. In particular, provision is made for the units which receive the first signal and/or the second signal to comprise at least one microcontroller which evaluates the data stream on the first data line and/or the second data line. The microcontroller respectively additionally preferably evaluates the battery cell voltages using an analog/digital converter in order to connect battery cells to the battery system or to bridge battery cells, with the result that said battery cells are virtually disconnected from the battery system, taking into account the evaluation results. In this configuration variant, the microcontroller respectively also preferably evaluates the periodic clock signal and/or controls the data outputs, via which the first signal is passed to the first data line and the second signal is passed to the second data line, via isolated open collector outputs and/or reads in the signals on the first data line and/or the second data line. It is possible to dispense with generating a sawtooth voltage in this configuration variant.

In order to achieve the object mentioned at the outset, a battery system having a plurality of battery cells and a battery management system is also proposed, the battery system being designed to carry out a method according to the disclosure.

BRIEF DESCRIPTION OF THE SEVERAL VIEWS OF THE DRAWING(S)

Structural features of the battery system according to the disclosure as well as further advantageous details, features and configuration details of the disclosure are explained in more detail in connection with the exemplary embodiments illustrated in the figures, in which.

DETAILED DESCRIPTION OF THE INVENTION

Figure 1:
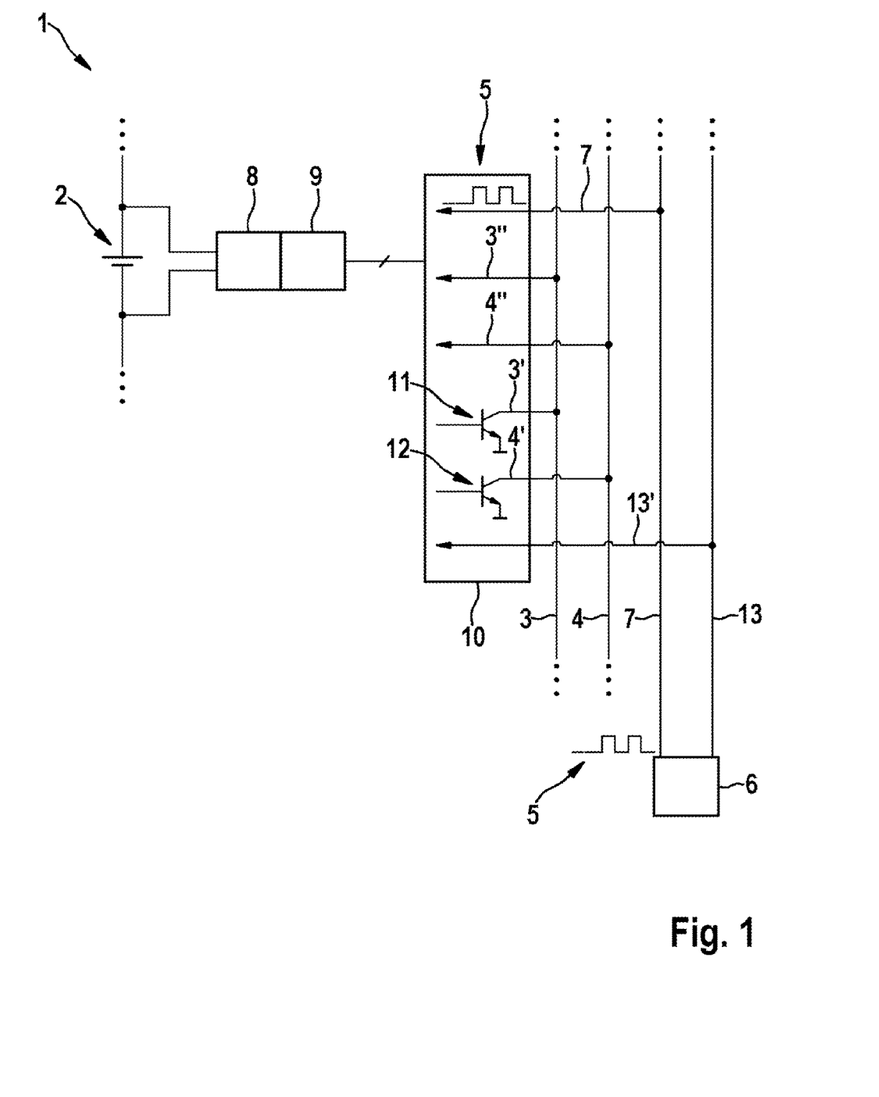
FIG. 1 shows a schematic illustration of a section of an exemplary embodiment for a battery system designed to carry out a method according to the disclosure.

FIG. 1 illustrates a section of a battery system 1. The battery system 1 comprises a plurality of battery cells 2. For reasons of better clarity, only one battery cell 2 is illustrated in the exemplary embodiment shown in FIG. 1. The battery system 1 comprises a central control device unit 6 as part of a battery management system of the battery system 1. The control device unit 6 generates a periodic clock signal 5 having a fixed period duration. In this case, the clock signal 5 is passed to a line 7 and is supplied to a multiplicity of units of the battery system 1. The battery system 1 also comprises a first data line 3 for transferring minimum values of a battery system parameter and a second data line 4 for transferring maximum values of a battery system parameter. The battery system 1 also comprises at least one further line 13, via which the central control device unit 6 can interchange data with the further units of the battery system 1, the further units each being connected to the line 13 via a signal line 13'.

In the battery system 1, the battery cell voltage of a battery cell 2 is respectively recorded by a microcontroller 9 as a battery system parameter via an analog/digital converter 8. In this case, a microcontroller 9 of the battery system 1 is respectively connected, via an isolator unit 10, to the data lines 3, 4, 7, 13 for transmitting and receiving data.

A microcontroller 9 of the battery system 1, a section of which is illustrated in FIG. 1, generates a first pulse-width-modulated signal for the purpose of transferring a minimum value of a battery cell voltage and generates a second pulse-width-modulated signal for the purpose of transferring a maximum value of a battery cell voltage synchronously in phase with the clock signal generated by the control device unit 6. In this case, the first signal can assume either a first signal state (low) or a second signal state (high). The second signal can likewise assume either a first signal state (low) or a second signal state (high). The first signal is passed to the first data line 3 via the open collector output 3' of a first isolator 11. The second signal is passed to the second data line 4 via the open collector output 4' of a second isolator 12. A microcontroller 9 of the battery system 1 can advantageously respectively receive signals transferred on the first data line 3 and/or on the second data line 4 via the inputs 3" and 4". These received signals can be advantageously evaluated by the respective microcontroller 9 and, in particular, can be used by this microcontroller 9 to regulate the battery system 1, in particular by bridging the battery cell 2 associated with the respective microcontroller 9 or connecting it to the battery system 1.

Figure 2:
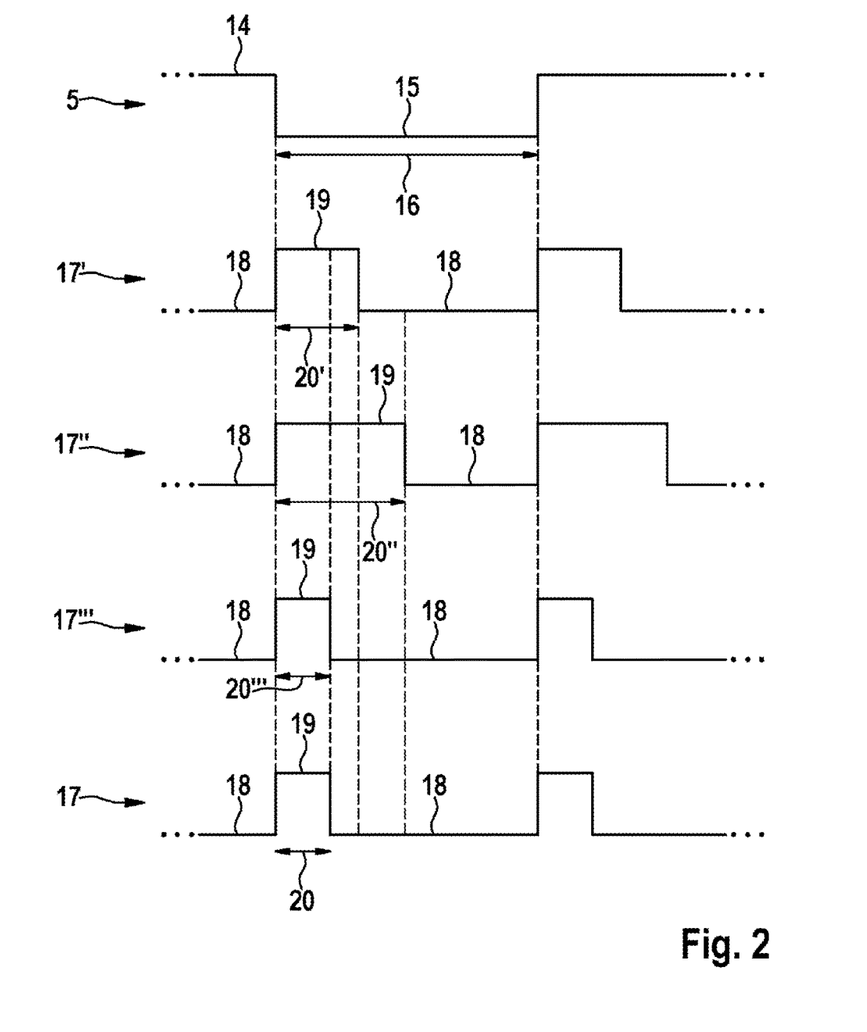
FIG. 2 shows a schematic illustration of an exemplary embodiment for a first signal generated using the method according to the disclosure.

The inventive transfer of minimum values of a battery system parameter is explained in more detail in connection with FIG. 2. The inventive transfer of maximum values of a battery system parameter is explained in more detail in connection with FIG. 3. In this case. FIG. 2 shows a predefined clock signal 5 having a fixed period duration 16. In this case, the clock signal 5 is in the form of a square-wave signal and can assume a first signal state 14 (high) or a second signal state 15 (low). Pulse-width-modulated signals 17', 17", 17''' each representing a value of a battery system parameter are generated as first signals synchronously in phase with the clock signal 5. The first signal 17' may be, for example, a first signal which is generated by the microcontroller 9 of the battery system 1 illustrated in FIG. 1 and represents the value of a battery cell voltage dropped across the battery cell 2. In this case, the first signals 17" and 17''' are the first signals which are generated by further microcontrollers of the battery system 1 not illustrated in FIG. 1 and in turn each represent the value of a battery cell voltage as the battery system parameter. As illustrated by way of example in FIG. 2, the first signals 17', 17" and 17''' can each assume a first signal state 18 (low) or a second signal state 19 (high). In this case, a minimum battery system parameter is represented on the first data line by a transition from the first signal state 18 to the second signal state 19. The value of the respective battery system parameter is represented by the duration of time for which the second signal state 19 is held, that is to say by the respective pulse duration 20', 20", 20''', based on the period duration 16 of the clock signal 5. In FIG. 2, the signal 17" therefore represents the smallest value of a battery system parameter.

The first signals 17', 17" and 17''' are logically linked to one another by means of an AND operation, for example by virtue of the signals each being passed to the first data line 3 via a corresponding open collector output 3', as illustrated in FIG. 1 for the shown section of the battery system 1. The signal 17 illustrated in FIG. 2 results from the ANDing of the first signals 17', 17" and 17'''. This corresponds to the signal 17''' corresponding to the minimum value of the recorded battery system parameter. The signal 17 is therefore transferred via the first data line of the battery system. Referring to FIG. 1, the signal 17 would therefore be transferred via the data line 3, for example to the central control device unit 6 and/or to the microcontroller 9 of further battery cells 2 of the battery system 1 via isolator units 10 by means of corresponding connections 3". The pulse width 20 of the signal 17 in this case represents the minimum value from the recorded battery system parameters, the period duration 16 of the clock signal 5 being used as the reference.

Figure 3:
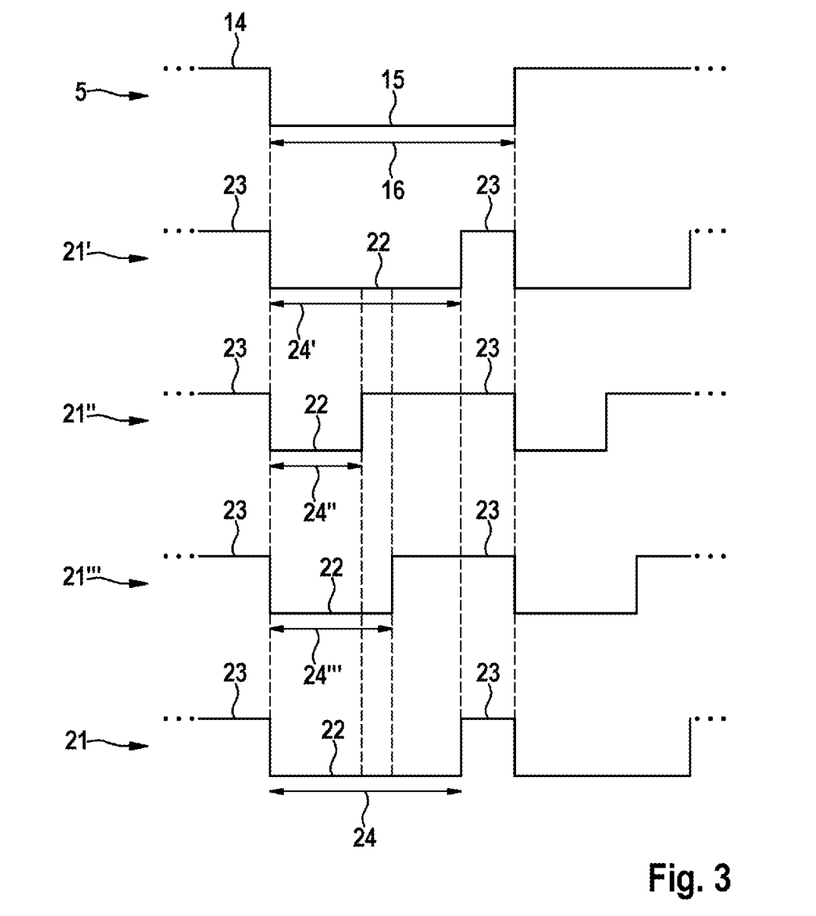
FIG. 3 shows a schematic illustration of an exemplary embodiment for a second signal generated using a method according to the disclosure.

A maximum value of a battery system parameter is transferred in a similar manner, as illustrated by way of example in FIG. 3. A second signal 21', 21", 21''' which can assume either a first signal state 22 (low) or a second signal state 23 (high) is likewise generated for each value of the battery system parameter synchronously in phase with a central clock signal 5 having a fixed period duration 16 and is passed to the second data line, that is to say to the data line 4 referring to FIG. 1. In this case, a maximum battery system parameter is represented on the second data line by a transition from the second signal state 23 (high) to the first signal state 22 (low). In this case, the value of the respective battery system parameter is represented, in the signals 21', 21", 21''', by the respective duration of time for which the first signal state 22 (low) is held, that is to say the respective pulse width 24', 24", 24''', based on the period duration 16 of the clock signal 15. In this case, the signal 21" represents the maximum value of the battery system parameter. Since only the maximum value of the battery system parameter is intended to be transferred, the second signal passed to the second data line for a value of the battery system parameter, for example the signal 21' on the second data line, is logically linked by means of second signals passed to the second data line at the same time, that is to say the signals 21" and 21''' for the further values of the battery system parameter for example, in the present case by means of an AND operation, with the result that the resulting signal 21, which represents the maximum value of the battery system parameter, is transferred via the second data line. In this case, the pulse length 24 of the signal 21 represents the maximum value of the respective battery system parameter, the period duration of the clock signal 5 being used as the reference. Referring to FIG. 1, the signal 21 would be available for use to the central control device unit 6 via the data line 4 and would be available for use to the microcontrollers 9 of further battery cells 2 of the battery system 1 via isolator units 10 by means of corresponding connections 4".

Figure 4:
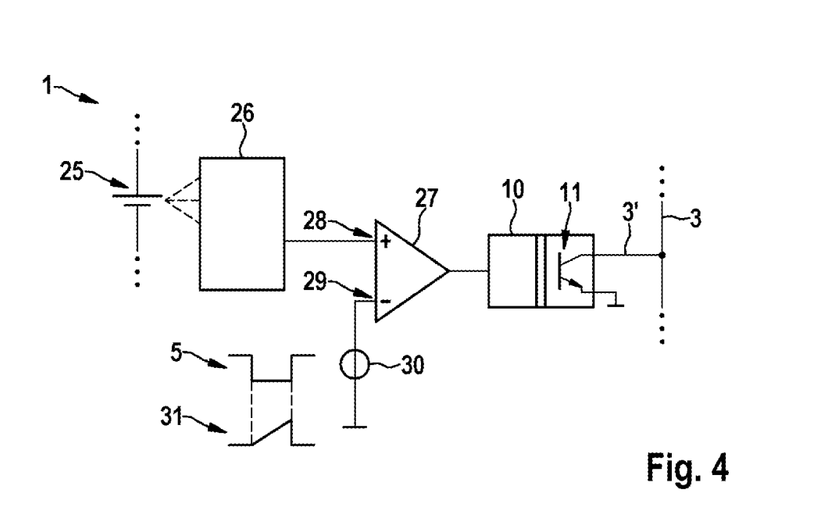
FIG. 4 shows a schematic illustration of a section of a further exemplary embodiment for a battery system designed to carry out a method according to the disclosure.

FIG. 4 shows a section of a further exemplary embodiment for a battery system 1 which is designed to transfer a minimum value and a maximum value of a battery system parameter from a set of values for this battery system parameter. The battery system 1 has a plurality of battery modules 25 (only one battery module 25 is illustrated in FIG. 4 for reasons of better clarity). In this case, a battery module 25 comprises a plurality of battery cells, preferably lithium ion cells, electrically connected to one another. In this case, the section shown in FIG. 4 is accordingly repeated for each battery module 25 of the battery system 1. The minimum and/or maximum battery cell voltage of the battery cells of each battery module 25 of the battery system 1 is/are determined using known metrology by means of an evaluation unit 26 respectively associated with a battery module 25.

In the battery system 1, a section of which is illustrated in FIG. 4, a sawtooth voltage 31 is respectively generated by a sawtooth generator 30 synchronously in phase with a central clock signal 5 in this case. The minimum voltage of a battery cell of the battery module 25, as recorded by the evaluation unit 26, is compared in this case by comparing the recorded voltage with the sawtooth voltage 31 using a comparator unit 27 of the battery system 1. In this case, the comparator unit 27 has a positive input 28 and an inverting input 29. In order to generate the first signal representing the value of a battery cell voltage, the minimum voltage recorded by the evaluation unit 26 is applied to the positive input 28 of the comparator unit 27. The sawtooth voltage 31 is applied to the inverting input 29 of the comparator unit 27. The signal generated by the comparator unit 27 is passed to the first data line 3 of the battery system 1 via the open collector output 3' of the isolator unit 10. Since the procedure is respectively the same for further battery modules 25 for minimum voltages of a battery cell of the respective battery module 25, the generated first signals on the first data line 3 of the battery system 1 are again ANDed, the signal which represents the value of the minimum voltage of all battery modules 25 being transferred via the data line 3, for example to a central control device unit. The generation of a first signal using a sawtooth voltage and a comparator unit is explained in more detail in connection with FIG. 9. The sawtooth voltage 31 synchronously in phase with the clock signal 5 is advantageously generated as explained in connection with FIG. 5.

Figure 5:
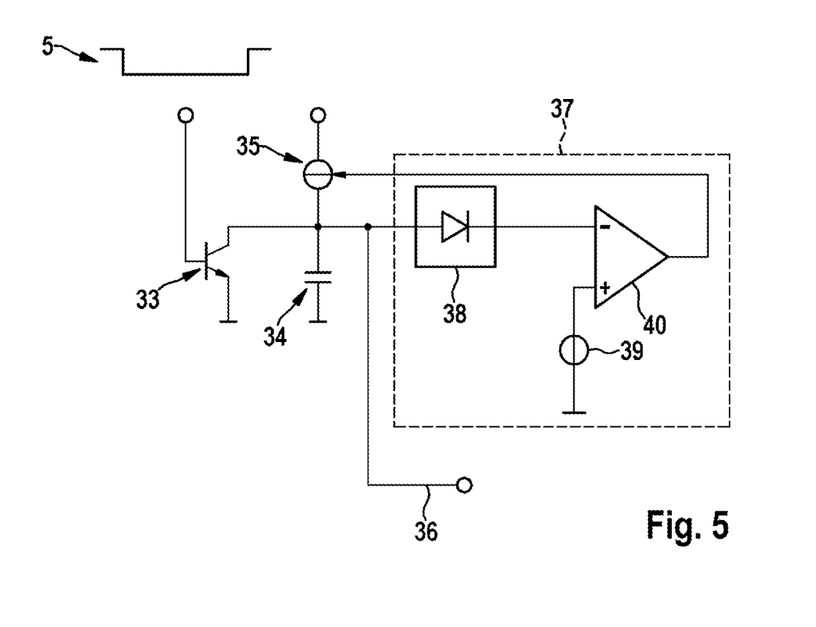
FIG. 5 shows a schematic illustration of an exemplary embodiment for generating a sawtooth voltage synchronously in phase with a clock signal for use in a method according to the disclosure.

FIG. 5 illustrates a simplified schematic illustration of a circuit which can be used to generate a sawtooth voltage 31 which is in sync with a clock signal 5 and can be tapped off via the line 36. In this case, the clock signal 5 controls a switching element 33. In this case, the switching element 33 is preferably in the form of a MOSFET. If the clock signal 5 has a first signal state, the switching element 33 closes. During a second signal state of the clock signal, the switching element 33 opens. If the switching element 33 is open, the capacitor is charged in a ramped manner by the current source 35. If the switching element 33 is closed, the capacitor is discharged again via the switching element 33. So that the ramp gradient is the same in all units of a battery system which record a voltage as the battery system parameter, the current from the current source 35 is regulated using a regulating device 37. The current charging the capacitor 34 is regulated using a peak detection unit 38 and an operational amplifier circuit 40 in such a manner that the voltage of the capacitor 34 corresponds to a predefined reference voltage from a reference voltage source 39 at the time at which the clock signal 5 changes from the first signal state to the second signal state.

Figure 6:
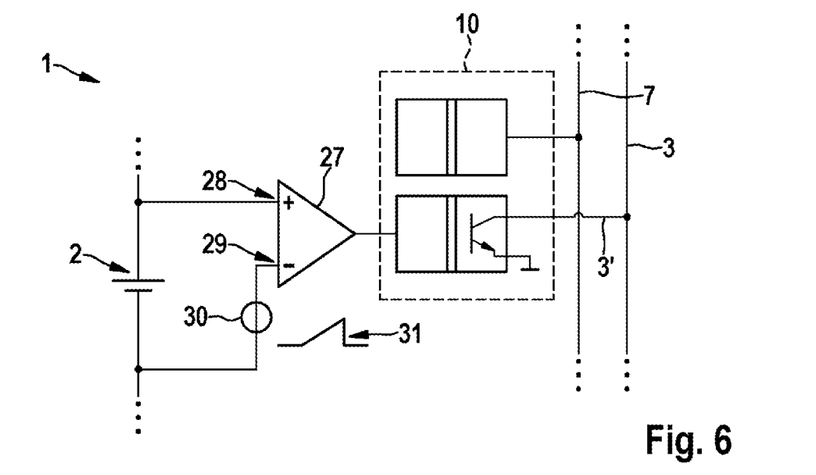
FIG. 6 shows a schematic illustration of a section of a further exemplary embodiment for a battery system designed to carry out a method according to the disclosure.
Figure 7:
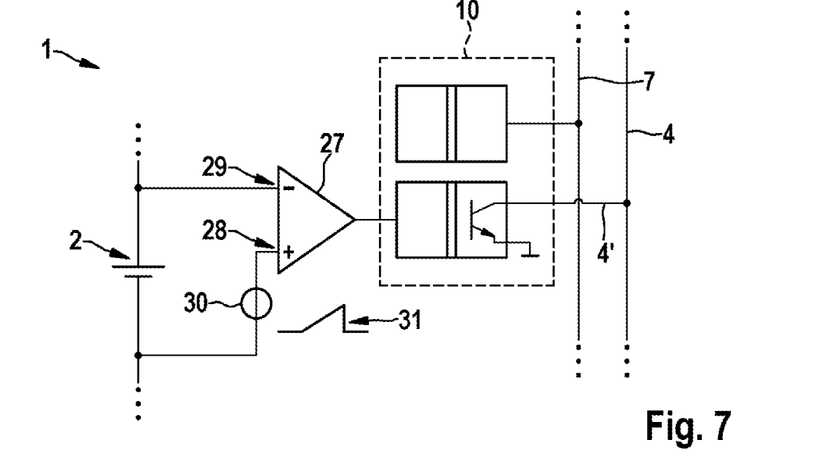
FIG. 7 shows a schematic illustration of a section of a further exemplary embodiment for a battery system designed to carry out a method according to the disclosure.

FIG. 6 and FIG. 7 each illustrate a schematic illustration of the section of a further exemplary embodiment for a battery system 1. FIG. 6 schematically illustrates how a minimum value of a battery cell voltage is transferred. FIG. 7 shows a possible implementation for transferring the maximum value of a battery cell voltage. In this case, these implementations each manage without a microcontroller which records a minimum or maximum battery cell voltage from a plurality of battery cell voltages. A battery system 1 particularly preferably has a combination of the principle illustrated in FIG. 6 and FIG. 7, that is to say such a battery system is designed to transfer a minimum value of a battery cell voltage, as explained in connection with FIG. 6, and to transfer a maximum value of a battery cell voltage, as explained in connection with FIG. 7. In this case, a corresponding identical implementation is provided for each battery cell 2 of a battery system 1 for the purpose of generating a signal which is passed to the data line 3 (FIG. 6) or to the data line 4 (FIG. 7).

Both in the exemplary embodiment illustrated in FIG. 6 and in the exemplary embodiment illustrated in FIG. 7, a central clock signal having a fixed period duration is respectively predefined via a line 7, in particular a clock signal as explained in connection with FIG. 2 and FIG. 3. In this case, a sawtooth voltage 31 is respectively generated by a sawtooth generator 30 synchronously in phase with the clock signal (preferably as explained in connection with FIG. 5).

In the exemplary embodiment illustrated in FIG. 6, the sawtooth voltage 31 is passed to the inverting input 29 of a comparator unit 27. A battery cell voltage applied to a battery cell 2 is passed to the non-inverting input of the comparator unit 27. In this case, the generation of the first signal using the comparator unit 27 is explained in more detail in connection with FIG. 9.

The signal which is generated by the comparator unit 27 and may have the form of the signal 17 illustrated in FIG. 2, for example, is passed to the first data line 3 via an isolator unit 10. Since such a first signal is generated for each battery cell 2 of the battery system 1, these first signals on the first data line 3 are ANDed by means of the connection provided, with the result that the minimum value of a battery cell voltage is transferred via the first data line 3, for example to a central control device unit.

In the exemplary embodiment illustrated in FIG. 7, the comparator unit 27 is connected in the reverse manner since, in order to transfer the maximum value of a battery cell voltage on the second data line 4, provision is made for a maximum battery cell voltage on the second data line 4 to be represented by a transition from the second signal state (high) to the first signal state (low). In the exemplary embodiment illustrated in FIG. 7, a sawtooth voltage 31 synchronously in phase with the clock signal is therefore passed to the positive input 28 of the comparator unit 27 and a battery cell voltage present at a battery cell 2 is applied to the inverting input 29 of the comparator unit 27. The output signal from the comparator unit 27 is passed to the second data line 4 via an isolator unit 10. Since a second signal is generated in a corresponding manner for each battery cell 2 of the battery system 1, the second signals generated are ANDed, as explained in connection with FIG. 3 for example, with the result that the maximum value of a battery cell voltage is transferred on the second data line 4 as a pulse-width-modulated signal. The second signal transferred on the data line 4 may be formed like the signal 21 illustrated in FIG. 3, for example. The ratio of the pulse width of the second signal to the period duration of the clock signal 5 advantageously reveals the maximum value of the battery cell voltage in this case.

Figure 8:
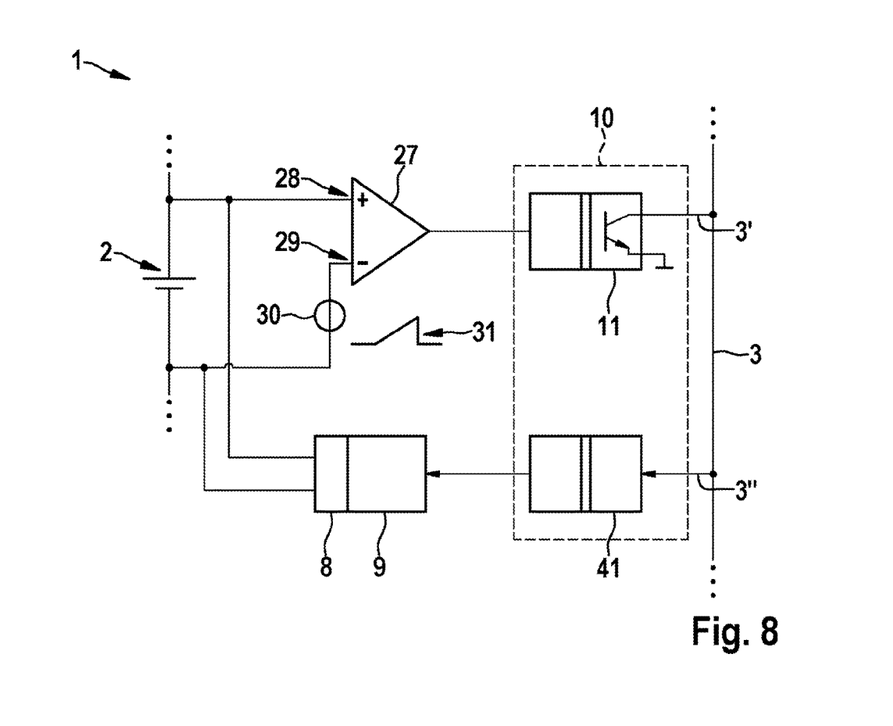
FIG. 8 shows a schematic illustration of a section of a further exemplary embodiment for a battery system designed to carry out a method according to the disclosure.

FIG. 8 shows, by way of example, a further development of the battery system 1, a section of which is illustrated in FIG. 6. In the exemplary embodiment of a battery system 1 according to the disclosure, as illustrated in FIG. 8, an analog/digital converter 8 and a microcontroller 9 are advantageously associated with each battery cell 2, signals transferred via the first data line 3 advantageously being supplied to the microcontroller 9 as input signals via an isolator unit 41. The respective microcontroller 9 advantageously uses these input signals to implement further functions of a battery management system. In particular, provision is made for the microcontroller circuits 9 to be designed to carry out cell balancing using the input signals, that is to say the transferred minimum and/or maximum battery cell voltages in particular, and/or to connect individual battery cells 2 to the battery system and/or to disconnect individual battery cells 2 from the battery system 1 by means of bridging.

Figure 9:
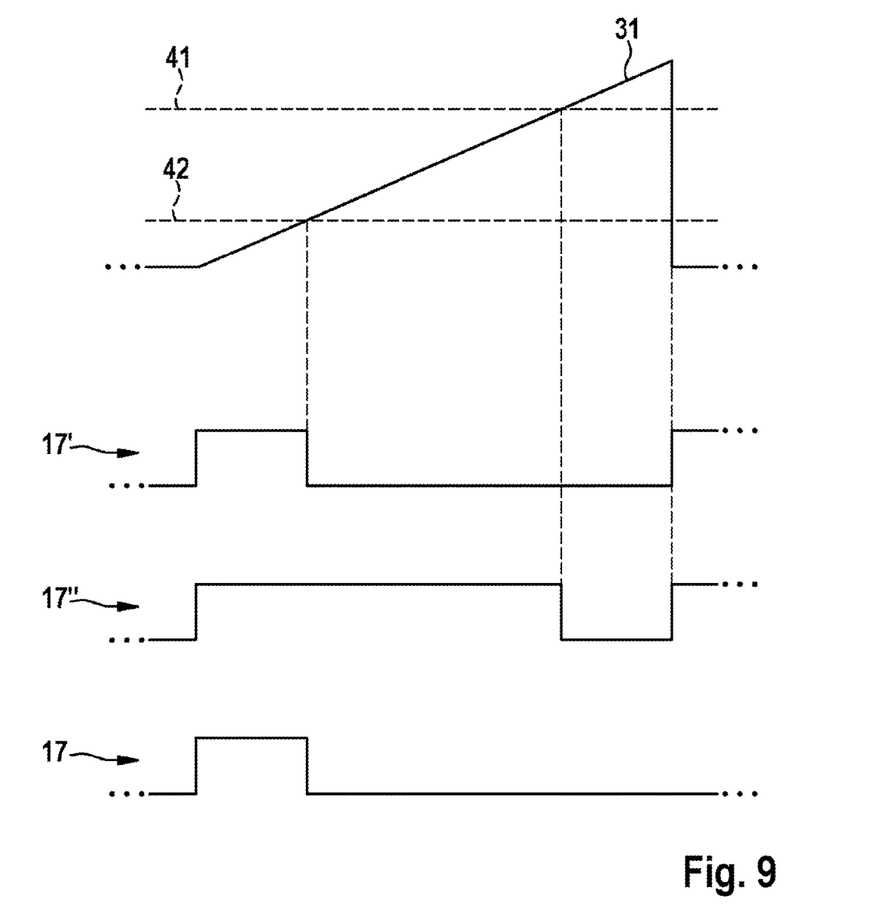
FIG. 9 shows a schematic illustration of an exemplary embodiment for generating a first signal using a sawtooth voltage.

The generation of a first signal 17 using a sawtooth voltage 31 and a comparator unit 27, as described in connection with FIG. 4, FIG. 6 and FIG. 8, is explained by way of example using FIG. 9. In the example shown in FIG. 9, the set of compared battery cell voltages is two; a battery cell voltage 41 and a battery cell voltage 42 are recorded. As explained in connection with FIG. 6, the battery cell voltage 41 is compared in this case with a sawtooth voltage 31 synchronously in phase with a clock signal using a comparator unit. At the same time, a battery cell voltage 42 is compared with a sawtooth voltage 31 synchronously in phase with the clock signal via a further comparator unit. In this case, the battery cell voltage 41 and the battery cell voltage 42 are each applied to the non-inverting input of the comparator unit. The sawtooth voltage is respectively applied to the inverting input of the respective comparator unit. The first signals 17' and 17" generated by the comparator units are passed to a first data line in this case. The signal 17' is produced in this case, as the output signal from the respective comparator unit, by comparing the battery cell voltage 42 with the sawtooth voltage 31 and the signal 17" is produced, as the output signal from the respective comparator unit, by comparing the battery cell voltage 41 with the sawtooth voltage 31. In this case, the first signals 17' and 17" are logically ANDed by means of the corresponding connection, as explained in connection with FIG. 6 for example, with the result that the signal 17 resulting from the AND operation is transferred via the data line 3. In the signal 17 illustrated in FIG. 9, the transition of the signal state from "low" to "high" indicates a minimum battery cell voltage. The pulse width of the signal, that is to say the duration of time for which the "high" state of the signal 17 is held, with respect to the period duration of the clock signal represents the value of the minimum battery cell voltage in this case.

The signal which is transferred via a second data line 4 and represents the maximum value of a battery cell voltage is produced in a corresponding manner as the output signal from a comparator unit 27, the sawtooth voltage being passed to the non-inverting input 28 and a recorded battery cell voltage being passed to the inverting input 29 of the comparator unit 27.

The exemplary embodiments illustrated in the figures and explained in connection with the latter are used to explain the disclosure and do not restrict the latter.

SEQUENCE LISTING

Not Applicable

The invention claimed is:

1. A method for transferring at least one of (i) a minimum value and (ii) a maximum value of a battery system parameter from a set of values for the battery system parameter in a battery system comprising a plurality of battery cells, the method comprising:
generating a periodic clock signal having a fixed period duration; and
at least one of:
(i) transferring the minimum value of the battery system parameter by generating a first signal for each of the respective values of the set of values for the battery system parameter, synchronously in phase with the clock signal and passing the first signal to a first data line, wherein the first signal for each of the respective values of the set of values has a first signal state and a second signal state, a presence of the respective value on the first data line being indicated by a transition from the first signal state to the second signal state, a duration of time for which the second signal state is held after the transition from the first signal state to the second signal state based on the period duration of the clock signal being used to indicate the respective value from the set of values; and
(ii) transferring the maximum value of the battery system parameter by generating a second signal for each of the respective values of the set of values for the battery system parameter, synchronously in phase with the clock signal and passing the second signal to a second data line, wherein the second signal for each of the respective values of the set of values has a first signal state and a second signal state, a presence of the respective value on the second data line being indicated by a transition from the second signal state to the first signal state, a duration of time for which the first signal state is held after the transition from the second signal state to the first signal state based on the period duration of the clock signal being used to indicate the respective value from the set of values.

2. The method as claimed in claim 1, further comprising at least one of:
logically linking the first signal which was passed to the first data line for each of the respective values of the set of values for the battery system parameter such that the minimum value of the battery system parameter is transferred via the first data line; and
logically linking the second signal on the second data line which was passed to the second data line for each of the respective values of the set of values for the battery system parameter such that the maximum value of the battery system parameter is transferred via the second data line.

3. The method as claimed in claim 1, further comprising:
recording as the set of values for the battery system parameter, at least one of a minimum voltage and (ii) a maximum voltage of a battery cell of a battery module of the battery system,
wherein the at least one of the transferring of the minimum value and the transferring of the maximum value comprises transferring the recorded at least one of the minimum voltage and the maximum voltage.

4. The method as claimed in claim 1, further comprising:
recording as the set of values for the battery system parameter, a battery cell voltage of a battery cell of the battery system,
wherein the at least one of the transferring of the minimum value and the transferring of the maximum value comprises transferring at least one of a minimum value and a maximum value of the recorded battery cell voltage.

5. The method as claimed in claim 1, wherein at least one of:

the first signal is passed to the first data line via a DC isolation device; and the second signal is passed to the second data line via a DC isolation device.

6. The method as claimed in claim 1, further comprising:

receiving and evaluating at least one of (i) the first signal passed to the first data line and (ii) the second signal passed to the second data line with units of the battery system.

7. The method as claimed in claim 2, further comprising:

generating a sawtooth voltage synchronously in phase with the clock signal;

recording a voltage whose at least one of minimum value and maximum value is to be transferred; and generating at least one of the first signal and the second signal by comparing the recorded voltage with the sawtooth voltage using a comparator having a positive input and an inverting input, the at least one of the first signal and the second signal being generated as the output signal from the comparator.

8. The method as claimed in claim 7, wherein at least one of:

in order to generate the first signal, the recorded voltage is respectively applied to the positive input of the comparator and the sawtooth voltage is respectively applied to the inverting input of the comparator; and in order to generate the second signal, the recorded voltage is respectively applied to the inverting input of the comparator and the sawtooth voltage is respectively applied to the positive input of the comparator.

9. The method as claimed in claim 7, wherein the generating of the sawtooth voltage comprises:

closing a switching element during a first signal state of the clock signal, a capacitor being charged in a ramped manner when the switching element is open; and opening the switching element during a second signal state of the clock signal, the capacitor being discharged when the switching element is closed.

10. The method as claimed in claim 9, wherein the generating of the sawtooth voltage further comprises:

regulating a current charging of the capacitor such that a voltage of the capacitor corresponds to a predefined reference voltage at the time at which the clock signal changes from the first signal state of the clock signal to the second signal state of the clock signal.

11. A battery system comprising:

a plurality of battery cells; and a battery management system configured to transfer at least one of (i) a minimum value and (ii) a maximum value of a battery system parameter from a set of values for the battery system parameter by:

generating a periodic clock signal having a fixed period duration; and at least one of:

(i) transferring the minimum value of the battery system parameter by generating a first signal for each of the respective values of the set of values for the battery system parameter, synchronously in phase with the clock signal and passing the first signal to a first data line, wherein the first signal for each of the respective values of the set of values has a first signal state and a second signal state, a presence of the respective value on the first data line being indicated by a transition from the first signal state to the second signal state, a duration of time for which the second signal state is held after the transition from the first signal state to the second signal state based on the period duration of the clock signal being used to indicate the respective value from the set of values; and (ii) transferring the maximum value of the battery system parameter by generating a second signal for each of the respective values of the set of values for the battery system parameter, synchronously in phase with the clock signal and passing the second signal to a second data line, wherein the second signal for each of the respective values of the set of values has a first signal state and a second signal state, a presence of the respective value on the second data line being indicated by a transition from the second signal state to the first signal state, a duration of time for which the first signal state is held after the transition from the second signal state to the first signal state based on the period duration of the clock signal being used to indicate the respective value from the set of values.

* * * * *